United States Patent
Specht et al.

(10) Patent No.: US 7,298,004 B2
(45) Date of Patent: Nov. 20, 2007

(54) CHARGE-TRAPPING MEMORY CELL AND METHOD FOR PRODUCTION

(75) Inventors: Michael Specht, München (DE); Wolfgang Roesner, Ottobrunn (DE); Franz Hofmann, München (DE)

(73) Assignee: Infineon Technologies AG, Munich (DE)

( * ) Notice: Subject to any disclaimer, the term of this patent is extended or adjusted under 35 U.S.C. 154(b) by 121 days.

(21) Appl. No.: 11/000,350

(22) Filed: Nov. 30, 2004

(65) Prior Publication Data

US 2006/0115978 A1   Jun. 1, 2006

(51) Int. Cl.
*H01L 29/788* (2006.01)
(52) U.S. Cl. .................... 257/315; 257/317
(58) Field of Classification Search ............ 257/315, 257/317, 320, 322, 324
See application file for complete search history.

(56) References Cited

U.S. PATENT DOCUMENTS

| | | | | |
|---|---|---|---|---|
| 6,137,132 | A * | 10/2000 | Wu | 257/315 |
| 2004/0036126 | A1* | 2/2004 | Chau et al. | 257/401 |
| 2005/0035393 | A1* | 2/2005 | Lung et al. | 257/314 |
| 2005/0139893 | A1 | 6/2005 | Hofmann et al. | |

FOREIGN PATENT DOCUMENTS

DE   102 20 923 A1   11/2003

OTHER PUBLICATIONS

Specht, M., et al., "Sub-40nm tri-gate charge trapping nonvolatile memory cells for high-density applications," 2004 Symposium on VLSI Technology, pp. 244-245.
Anil, K.G., et al., "Layout Density Analysis of FinFETs," Proceedings of the 33rd European Solid-State Device Research, vol., Iss., Sep. 16-18, 2003, pp. 139-142.
Sung, S-K., et al., "Fabrication and Program/Erase Characteristics of 30-nm SONOS Nonvolatile Memory Devices," IEEE Transactions on Nanotechnology, vol. 2, No. 4, Dec. 2003, pp. 258-264.

* cited by examiner

*Primary Examiner*—Theresa Doan
(74) *Attorney, Agent, or Firm*—Slater & Matsil, L.L.P.

(57) ABSTRACT

The memory cell array comprises a plurality of parallel fins provided as bitlines arranged at a distance of down to about 40 nm from one another and having a lateral dimension of less than about 30 nm, subdivided into pairs of adjacent first and second fins. A charge-trapping memory layer sequence is arranged on the fins. Wordlines are arranged across the fins, and source/drain regions are located in the fins between the wordlines and at the ends of the fins. There are preferably self-aligned contact areas of the source/drain regions at the ends of the fins, each contact area being common to the fins of one of said pairs. Select transistors and select lines are provided for the first and second fins individually to enable a separate addressing of the memory cells.

23 Claims, 7 Drawing Sheets

US 7,298,004 B2

CHARGE-TRAPPING MEMORY CELL AND METHOD FOR PRODUCTION

TECHNICAL FIELD

The present invention concerns nonvolatile charge-trapping memory devices with increased cell density and preferred production methods of such devices.

BACKGROUND

Nonvolatile memory cells that are electrically programmable and erasable can be realized as charge-trapping memory cells, which comprise a memory layer sequence of dielectric materials with a memory layer between confinement layers of dielectric material having a larger energy band gap than the memory layer. The memory layer sequence is arranged between a channel region within a semiconductor body and a gate electrode provided to control the channel by means of an applied electric voltage. Charge carriers moving from source to a drain through the channel region are accelerated and gain enough energy to be able to penetrate the lower confinement layer and to be trapped within the memory layer. Alternatively, the application of a high gate voltage enables charge carriers to tunnel through the lower confinement layer and to be trapped in the memory layer. The trapped charge carriers change the threshold voltage of the cell transistor structure. Different programming states can be read by applying the appropriate reading voltages. Examples of charge-trapping memory cells are the SONOS memory cells, in which each confinement layer is an oxide and the memory layer is a nitride of the semiconductor material, usually silicon.

Typical applications of memory products require a steady miniaturization of the memory cells. A reduction of the area that is required by an individual memory cell can be obtained by shrinking the cell structure or by an increase of the number of bits that can be stored within one memory cell transistor structure.

In the publication of Suk-Kang Sung et al.: "Fabrication and Program/Erase Characteristics of 30-nm SONOS Nonvolatile Memory Devices" in IEEE Transactions of Nanotechnology 2, 258-264 (2003), which is incorporated herein by reference, the fabrication of SONOS nonvolatile memory devices is described, which comprises a process sequence of a sidewall patterning technique. A layer sequence of silicon, silicon dioxide, and silicon nitride is provided, and the silicon nitride is laterally confined by an etching step. A layer of amorphous silicon is applied conformally all over the surface. An anisotropic etching produces a sidewall spacer adjacent to the silicon nitride layer. The nitride is removed, and the remaining spacer is used as a mask to structure the silicon dioxide layer. The silicon dioxide structure is then used to etch the pattern into the silicon layer. This process sequence is applied to fabricate SONOS memory devices on SOI substrates. A narrow silicon channel with 30 nm width was defined using the sidewall patterning technique. A memory layer sequence of oxide, nitride, and oxide was applied, on which a 100 nm thick polysilicon layer was deposited as gate material. The gate electrode was also patterned by means of the sidewalls patterning technique.

The publication of K. G. Anil et al.: "Layout Density Analysis of FinFETs" in Proceedings of the 33rd European Solid-State Device Research, pp. 139-142, which is incorporated herein by reference, describes FinFETs with either direct patterning or spacer patterning of the active area. The spacer lithography is especially applied to increase the effective device width of the FinFETs. An optimization of the aspect ratio is also discussed.

The publication of M. Specht et al.: "Sub-40 nm tri-gate charge trapping nonvolatile memory cells for high-density applications" in VLSI, 2004 Symposium on VLSI Technology, pp. 244-245, which is incorporated herein by reference, describes tri-gate charge-trapping nonvolatile memory cells in a NAND-type array. The channel region is located on three sides of a silicon fin, which is bridged by a wordline to form the triple gate having a length in the range from 30 nm to 80 nm.

SUMMARY OF THE INVENTION

In one aspect, the present invention provides a nonvolatile memory device with increased cell density comprising charge-trapping memory cells.

In a further aspect, the invention provides means to integrate two memory transistors within the minimal lithography dimension.

In still a further aspect, this invention provides a special production method for the inventive device structures.

The charge-trapping memory cell according to a preferred embodiment of this invention comprises a semiconductor substrate with a main surface carrying a plurality of parallel fins provided as bitlines and arranged at a distance of down to about 40 nm from one another, the fins having a lateral dimension with respect to the main surface of less than about 30 nm and being subdivided into a plurality of disjointed pairs of adjacent first and second fins. A memory layer sequence is provided for charge-trapping and arranged on surfaces of the fins. A plurality of parallel wordlines are arranged at a distance from one another across the fins, and source/drain regions are located in the fins between the wordlines and at the ends of the fins. There are contact areas of the source/drain regions at the ends of the fins, each contact area being common to the fins of one of the pairs. A first plurality of select transistors is located in the first fins between the plurality of wordlines and the contact areas, and a second plurality of select transistors is located in the second fins between the plurality of wordlines and the contact areas. Select lines are provided that connect the first plurality of select transistors, and further select lines are provided that connect the second plurality of select transistors.

Preferred embodiments comprise first and second pluralities of select transistors at both ends of the fins, at least some of the select transistors being normally-on transistors. It is advantageous that the fins can be formed in bulk substrate material. The contact areas are preferably located in self-aligned fashion between the first and second fin of the respective pair of fins and laterally limited by the fins.

The method for production of a charge-trapping memory cell according to the invention comprises the following steps: a hard mask layer and a sacrificial layer are applied onto a main surface of a semiconductor substrate; a resist mask that covers parallel strips on the sacrificial layer is formed; the sacrificial layer is etched by means of the resist mask, leaving sacrificial strips, after which the resist mask is removed; a layer of a spacer material is conformally deposited and etched back to form sidewall spacers at lateral sides of the sacrificial strips; a further resist mask is applied to cover striplike areas of the main surface running transversely across the sacrificial strips; the sacrificial strips are removed except for parts that are covered by the further resist mask, which is then removed; the hard mask layer is etched using the spacers and remaining parts of the sacrificial strips as a mask; the substrate is then etched by means of the hard mask layer as a mask to form parallel fins; a dielectric material is deposited in spaces between the fins and removed as well as the hard mask layer from the fins; a further resist mask comprising openings in areas of intended select transistors is formed; an implantation of a dopant is performed in these areas according to a desired threshold voltage of the select transistors; a memory layer sequence of dielectric materials provided for charge-trapping is deposited; and an electrically conductive material is deposited and structured, which is provided for wordlines running transversely over the fins and for select lines across the areas of the select transistors.

These and other features and advantages of the invention will become apparent from the following brief description of the drawings, detailed description and appended claims and drawings.

BRIEF DESCRIPTION OF THE DRAWINGS

The following detailed description refers to examples of the invention, which are shown in the figures.

Figure 1:
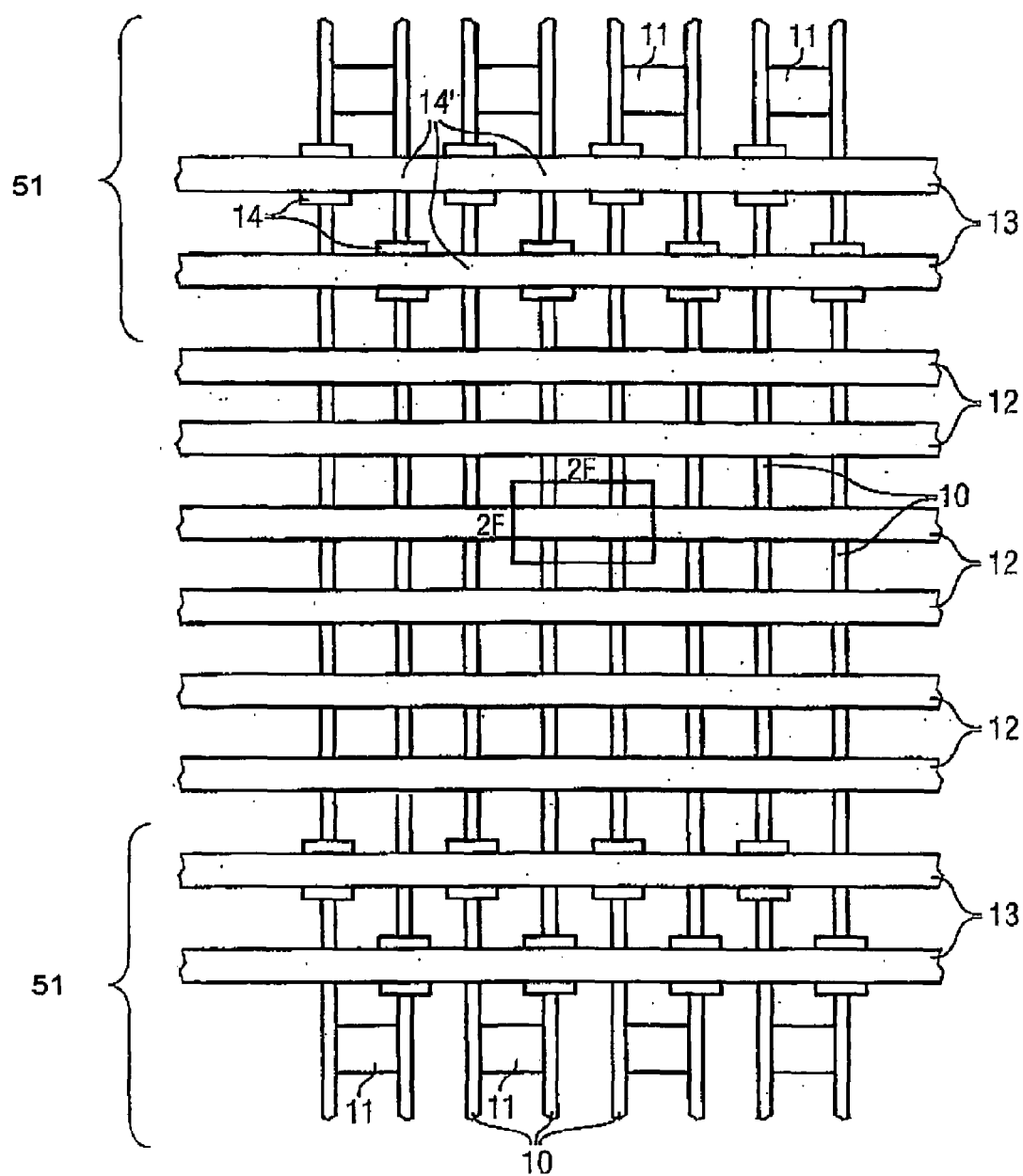
FIG. 1 shows a diagrammatic plan view on a memory cell array according to the invention.

The following list of reference symbols can be used in conjunction with the figures:
1 substrate
2 hard mask layer
3 sacrificial layer
4 resist mask
5 spacer
6 further resist mask
7 opening
8 dielectric material
9 memory layer sequence
10 fin
11 contact area
12 wordline
13 select line
14 normally-on select transistor
14' standard select transistor
15 metal layer
16 suicide layer
50 layer of spacer material
51 source/drain region

DETAILED DESCRIPTION OF ILLUSTRATIVE EMBODIMENTS

FIG. 1 shows a plan view onto the arrangement of wordlines and bitlines and the locations of the memory cells. The memory cells are situated in fins 10, which are ranged in parallel at a distance from one another. In the preferred embodiment, the distance is down to about 40 nm so that two cell transistors occupy the area of only $4F^2$. The fins are provided as bitlines and each comprise select transistors so that every memory cell can be addressed individually. FIG. 1 shows the select lines 13 leading to the select transistors 14, 14' that are arranged at the ends of the fins 10 in source/drain regions 51. Transistors 14 are normally-on select transistors enabling a current flow through the channel even if the gate voltage $V_g=0$. Transistors 14' are standard select transistors with no current if $V_g=0$.

Between the select lines 13, there is a plurality of wordlines 12 parallel to the select lines and to one another, which are provided to address the individual memory transistors. The contact areas 11 of the fins 10 are preferably arranged self-aligned to the fins 10. The extremely reduced dimension of the fins is achieved by means of the spacer technology according to the publications mentioned above.

The features of the charge-trapping memory cells will be further explained by the description of an especially adapted production method. This process is integrated in the standard CMOS process, including the preparation of the substrate with n-doped and p-doped wells. Shallow trench isolations are formed where necessary.

Figure 2:
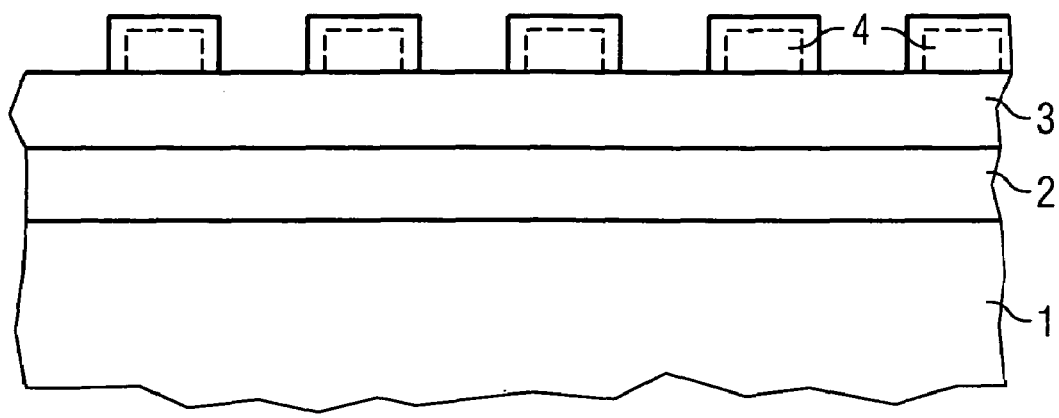
FIG. 2 shows a cross-section through an intermediate product of an especially preferred production method.

FIG. 2 shows a substrate 1, which is a semiconductor bulk, having a main surface on which a hard mask layer 2, preferably of silicon nitride, and a sacrificial layer 3, for example amorphous silicon or polysilicon having very small grain diameters, are applied. A resist mask 4 is formed on the sacrificial layer 3 and may be trimmed into the shape shown by dashed lines.

Figure 3:
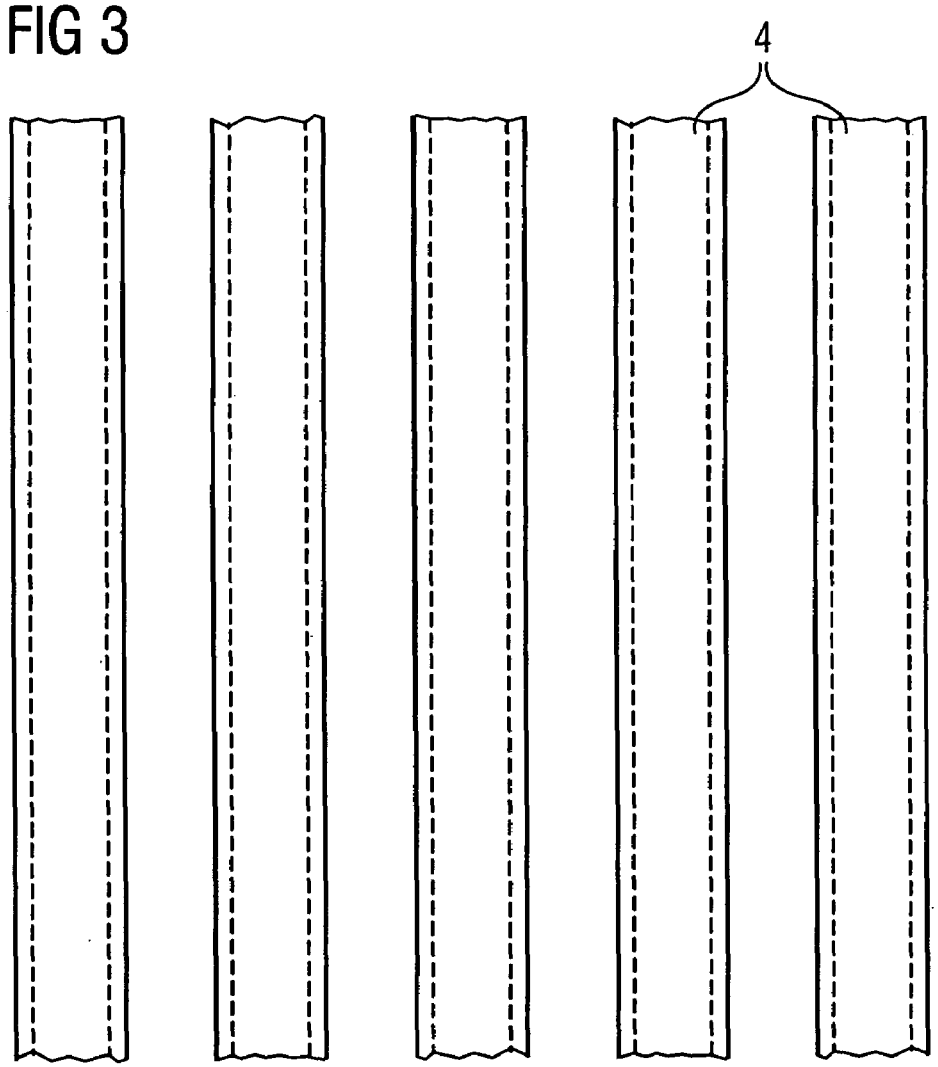
FIG. 3 shows a plan view of the structure of the resist mask used in the corresponding production step.

FIG. 3 shows the structure of the resist mask 4 in a plan view. The dashed lines show the limits of the mask openings after an optional trimming of the resist to obtain smaller resist strips. The (trimmed) resist mask 4 is used to structure the sacrificial layer 3. The remaining parts of the sacrificial layer 3 are strips having the lateral dimensions indicated by the vertical dashed lines in FIG. 2.

Figure 4:
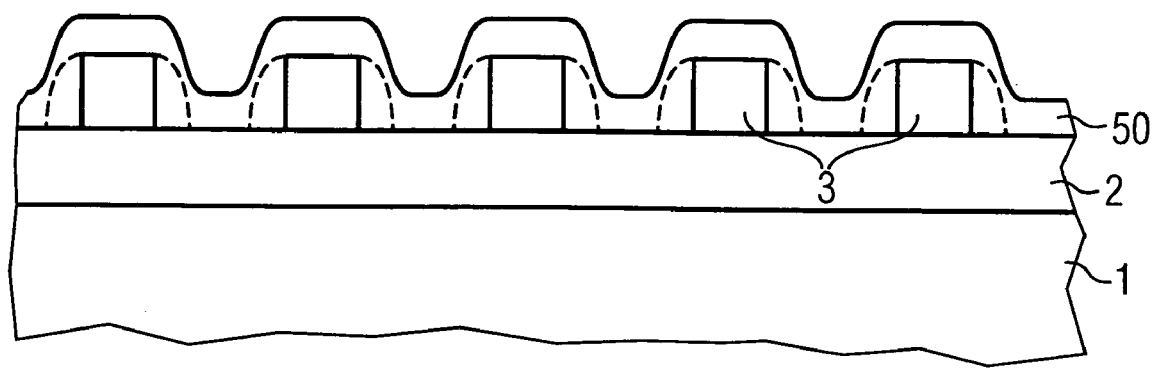
FIG. 4 shows the cross-section according to FIG. 2 after the application of a layer of spacer material.

FIG. 4 shows a cross-section according to FIG. 2 after the application of a layer 50 of spacer material. This layer is conformally deposited on the whole surface so that its thickness is essentially uniform. The dotted lines in FIG. 4 show the limits of the intended sidewall spacers. These spacers are produced in the way which is known per se by an anisotropic etching in the vertical direction. This anisotropic etching reduces the thickness of the layer 50 uniformly in the direction perpendicular to the main surface of the substrate 1. The sections of the layer 50 which are adjacent to the strips of the sacrificial layer 3 have comparatively larger vertical dimensions so that after the etching, which is performed down to the surface of the hard mask layer 2, only sidewall spacers of the indicated shape remain.

Figure 5:
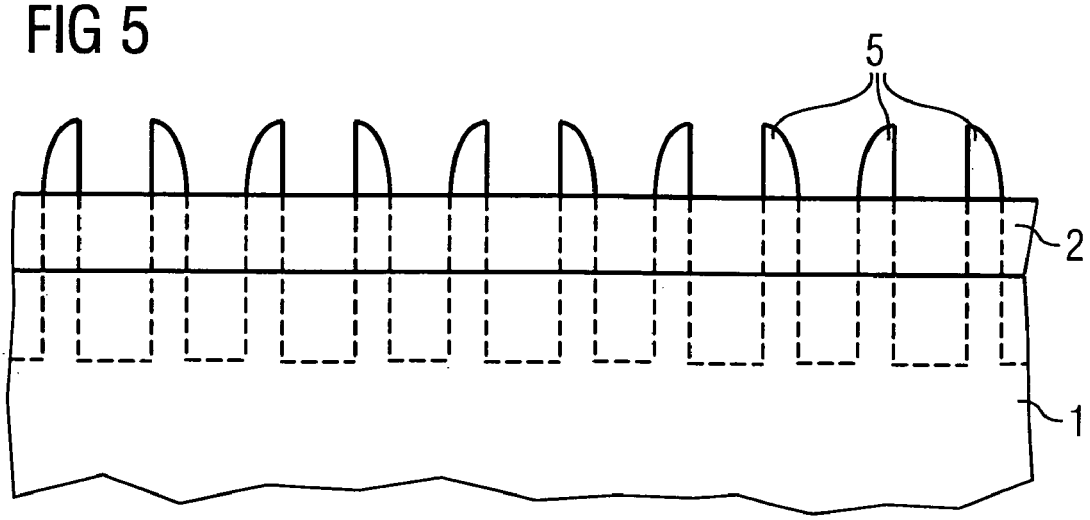
FIG. 5 shows the cross-section according to FIG. 4 after the formation of spacers.

FIG. 5 shows the cross-section according to FIG. 4 after the anisotropic etching of the spacers 5. The spacers 5 have a width, which is much smaller than a corresponding dimension, which is obtained by standard lithography. The spacers 5 are then used as a mask to etch trenches into the hard mask layer 2 and the substrate 1, which are indicated with dashed lines in the cross-section of FIG. 5. The remaining semiconductor material between the trenches forms the fins in the substrate 1. The spacer material is preferably silicon oxide. If the hard mask layer is nitride, the hard mask layer and the semiconductor substrate can be etched selectively to the oxide of the spacers 5.

Figure 6:
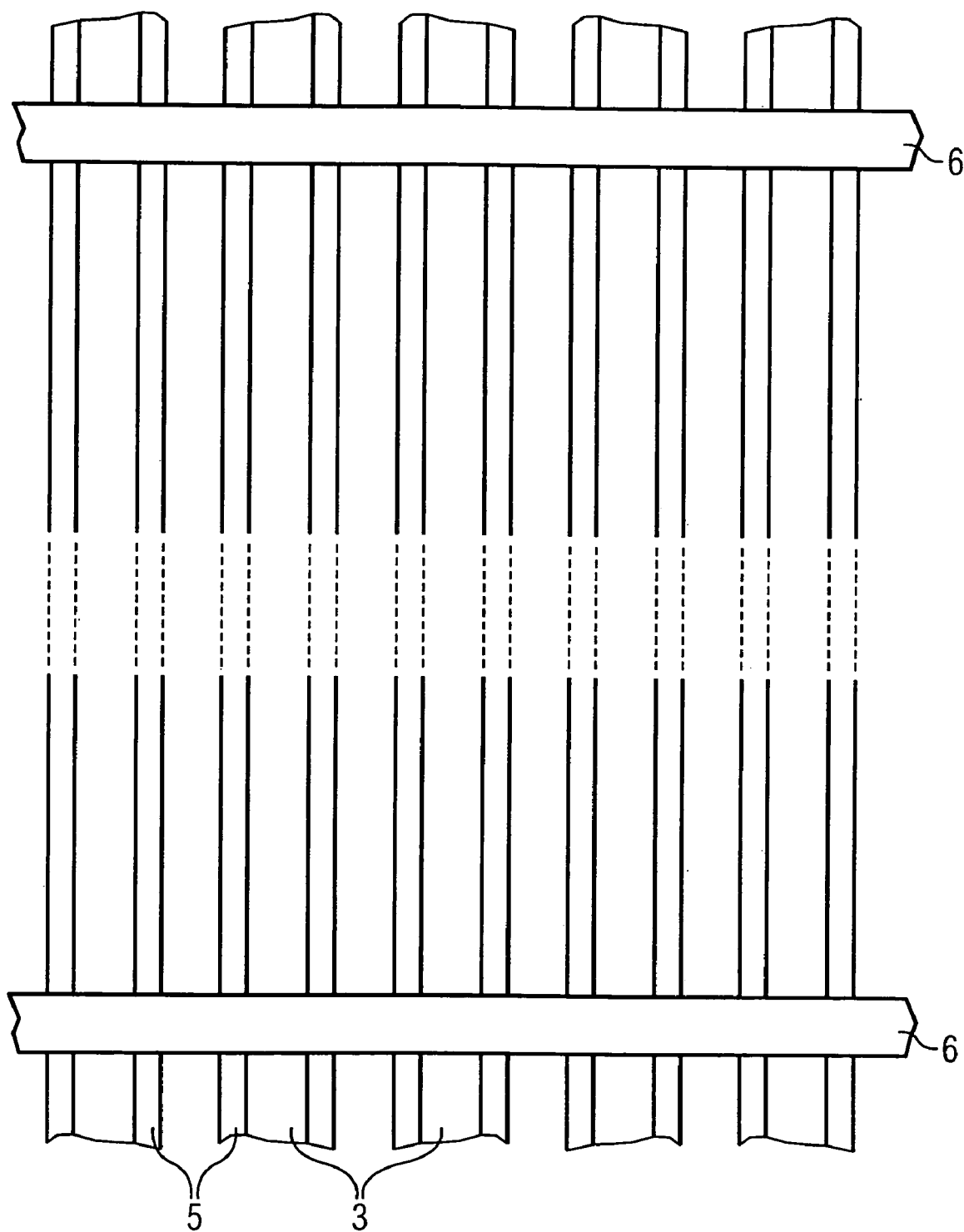
FIG. 6 shows the plan view according to FIG. 1 after the formation of a further resist mask.

FIG. 6 shows a diagrammatical plan view onto an intermediate product, before the remaining parts of the sacrificial layer 3 are removed. A further resist mask 6 is applied to the surface, which covers the regions provided for the contact areas of the fins. Therefore, when the sacrificial layer 3 is removed between the spacers 5, it is left in the areas that are provided for the contact areas. After the removal of the rest of the sacrificial layer 3 and the hard mask layer 2, the surface of the substrate 1 is structured into fins running parallel to one another and being arranged at a distance from one another, disjointed pairs of two neighboring fins being connected by the semiconductor material of the contact areas. The trenches between the fins are thus limited to the regions outside the contact areas. The semiconductor material of the substrate 1 has been doped to a suitable depth to form separate electrically conductive bitlines along the fins. Therefore, each pair of fins can be addressed via the contact area at the end of the two fins belonging to the respective pair. In order to enable an address of each bitline separately, select transistors are provided that switch each bitline individually.

Figure 7:
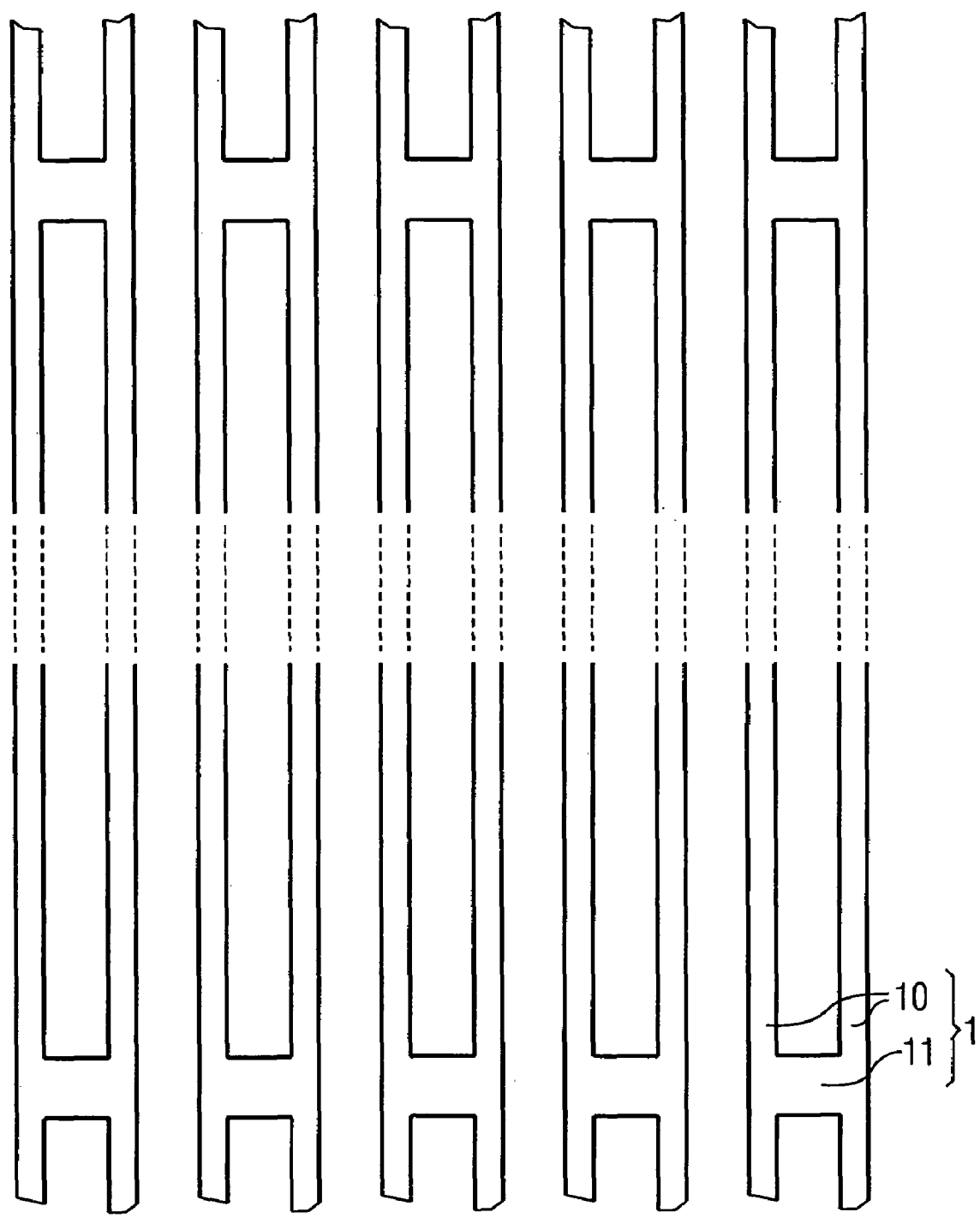
FIG. 7 shows a diagrammatic plan view of the structure of the fins and contact areas.

FIG. 7 shows the diagrammatic plan view according to FIG. 6 after the etching of the trenches to form the fins 10 and the removal of the further resist mask 6 to lay bare the contact areas 11 that limit the trenches in the longitudinal direction. Another mask is applied which is provided for the production of the normally-on select transistors.

Figure 8:
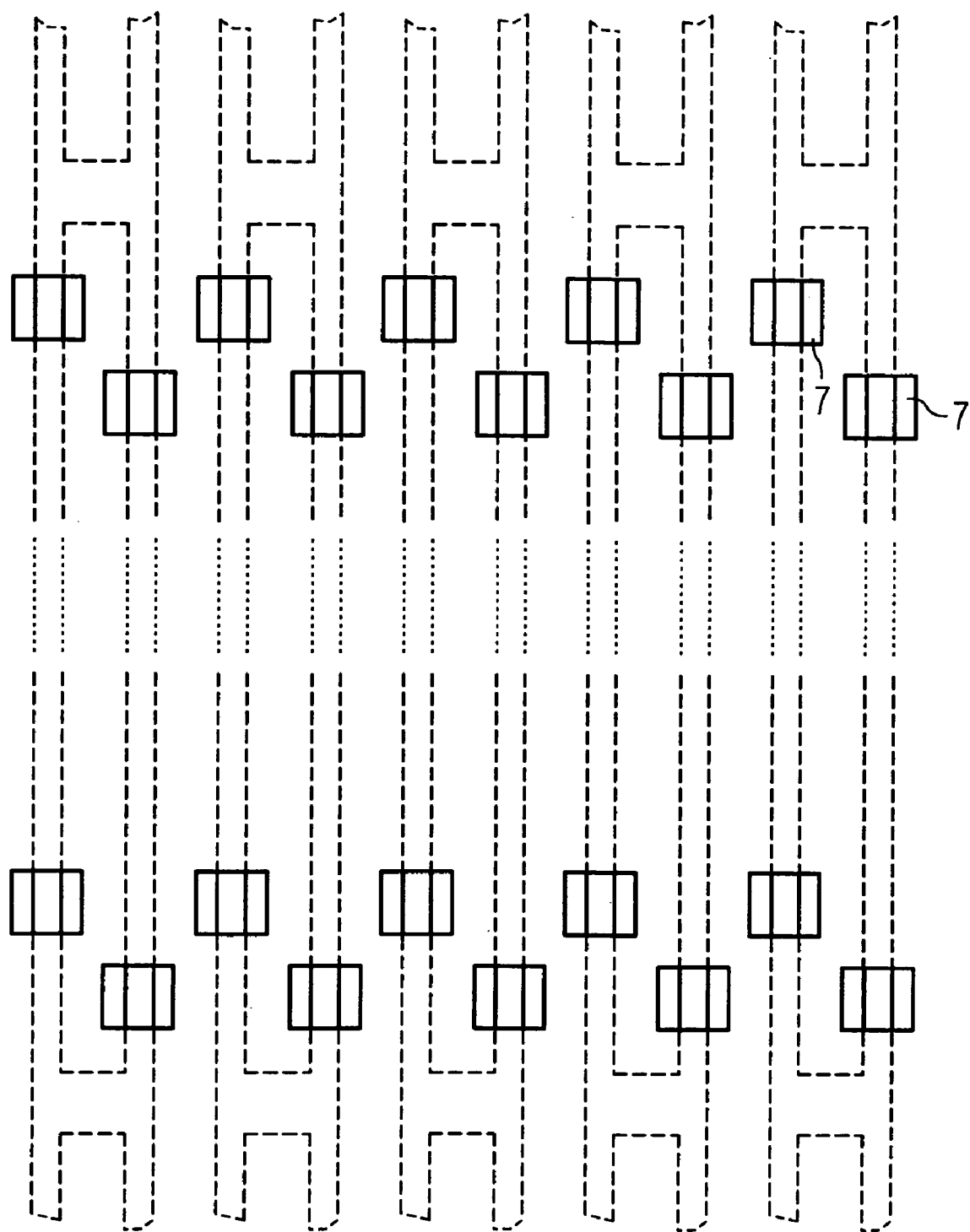
FIG. 8 shows the plan view according to FIG. 7 after the application of a further mask having openings in the areas of the select transistors.

This is seen in FIG. 8, which shows the diagrammatic plan view according to FIG. 7 after the application of a further resist mask having openings 7 in the areas of the intended normally-on select transistors 14. The rest of the fins and the contact areas are covered by this mask; therefore, the contours of the fins have been represented as hidden contours with dashed lines in FIG. 8. This further mask is used to perform an implantation intended for normally-on transistors in the areas provided for the select transistors.

Figure 9:
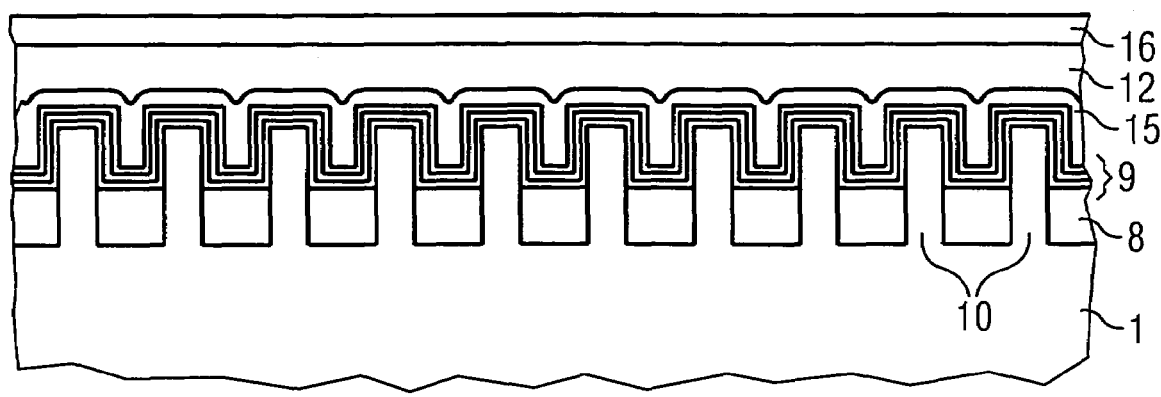
FIG. 9 shows the cross-section according to FIG. 5 after the production of the wordlines.

FIG. 9 shows a cross-section according to FIG. 5 after the production of wordlines. After the etching of the trenches and the application of the further resist mask to implant the select transistors, a dielectric material 8, for instance an oxide layer, can be deposited into the trenches and partially removed by chemical mechanical polishing so that only bottom parts of the trenches are filled with the dielectric material. A memory layer sequence 9 is applied all over the surface and is intended as a storage means. It can be partly removed, but is at least provided over the fins. This memory layer sequence comprises a memory layer of a dielectric material that is suitable for charge-trapping. The memory layer is arranged between upper and lower boundary layers or confinement layers having a larger energy bandwidth. The memory layer sequence may be an oxide-nitride-oxide layer sequence.

Preferably, but optionally, a metal layer 15 is deposited to form low-resistivity gatelines, which can be TaN. Then the material of the wordlines 12 is deposited, which may be polysilicon. The wordline 12 may be provided with a silicide layer 16 to reduce the electric resistivity. Both the metal layer 15 and the memory layer sequence 9 can be only 10 nm thick. If the fins are also 10 nm thick, the memory cell array can be realized to have a pitch of 40 nm. In this embodiment, the distance of the neighboring fins is 30 nm.

Although the present invention and its advantages have been described in detail, it should be understood that various changes, substitutions and alterations can be made herein without departing from the spirit and scope of the invention as defined by the appended claims.

What is claimed is:

1. A charge-trapping memory cell comprising:
a semiconductor substrate comprising a main surface;
a plurality of parallel fins provided as bitlines and arranged at a distance from one another on said main surface;
said fins comprising a lateral dimension with respect to said main surface of less than about 30 nm and being subdivided into a plurality of disjointed pairs of adjacent first and second fins;
a memory layer sequence provided for charge-trapping and arranged on surfaces of said fins;
a plurality of parallel wordlines arranged at a distance from one another across said fins;
source/drain regions located in said fins between said wordlines and at ends of said fins;
contact areas of said source/drain regions at said ends of said fins, each of said contact areas being common to the fins of one of said pairs;
a first plurality of select transistors located in said first fins of said pairs of fins between said plurality of wordlines and said contact areas;
a second plurality of select transistors located in said second fins of said pairs of fins between said plurality of wordlines and said contact areas; and
select lines coupling said first plurality of select transistors and said second plurality of select transistors, respectively.

2. The charge-trapping memory cell according to claim 1, wherein said first and second pluralities of select transistors comprise select transistors at both ends of said fins.

3. The charge-trapping memory cell according to claim 1, further comprising a normally-on select transistor being provided for every fin.

4. The charge-trapping memory cell according to claim 1, wherein said fins are formed in bulk substrate material.

5. The charge-trapping memory cell according to claim t, wherein said contact areas are located in self-aligned fashion between the first and second fin of the respective pair of fins and laterally limited by said fins.

6. The charge trapping memory cell according to claim 1, wherein the memory layer sequence is arranged on a top surface and sidewall surfaces of the fins.

7. The charge trapping memory cell according to claim 6, wherein two adjacent fins are separated by a trench, the memory layer sequence extending through the trench and overlying a dielectric region at a bottom portion of the trench.

8. The charge trapping memory cell according to claim 1, wherein the select lines comprise a first select line coupled to each select transistor in the first plurality of select transistors and a second select line coupled to each select transistor in the second plurality of select transistors.

9. The charge trapping memory cell according to claim 1, wherein the contact areas comprise fin portions integral and contiguous with the fins of the one of the pairs.

10. The charge trapping memory cell according to claim 1, wherein the select transistors are arranged such that each fin includes:
a first normally-on transistor adjacent a first end of the fin;
a first normally-off transistor adjacent the first end of the fin;
a second normally-on transistor adjacent a second end of the fin; and
a second normally-off transistor adjacent the second end of the fin.

11. The charge trapping memory cell according to claim 10, wherein the normally-on transistors of every other fin and the normally-off transistors of intervening fins between the every other fin are coupled to a common select line.

12. The charge trapping memory cell according to claim 11, wherein the normally-off transistors of the every other fin and the normally-on transistors of the intervening fins are coupled to a second common select line.

13. A charge-trapping memory cell comprising:
a semiconductor substrate comprising a main surface;
a plurality of parallel fins provided as bitlines and arranged at a distance from one another on said main surface, the finishing subdivided into a plurality of pairs of adjacent first and second fins;
a memory layer sequence provided for charge-trapping and ranged on surfaces of said fins;
a plurality of parallel wordlines arranged at a distance from one another across said fins;
source/drain regions located in said fins between said wordlines and at ends of said fins;
contact areas of said source/drain regions at said ends of said fins, each of said contact areas being common to the first and second fins of one of said pairs;
a first plurality of select transistors located in said first fins of said pairs of fins between said plurality of wordlines and said contact areas;
a second plurality of select transistors located in said second fins of said pairs of fins between said plurality of wordlines and said contact areas; and
select lines coupling said first plurality of select transistors and said second plurality of select transistors, respectively.

14. The charge-trapping memory cell according to claim 13, wherein said first and second pluralities of select transistors comprise select transistors at both ends of said fins.

15. The charge-trapping memory cell according to claim 13, further comprising a normally-on select transistor being provided for every Cm.

16. The charge-trapping memory cell according to claim 13, wherein said fins are formed in bulk substrate material.

17. The charge-trapping memory cell according to claim 13, wherein said contact areas are located in self-aligned fashion between the first and second fin of the respective pair of fins and laterally limited by said fins.

18. The charge trapping memory cell according to claim 17, wherein two adjacent fins are separated by a trench, the memory layer sequence extending through the trench and overlying a dielectric region at a bottom portion of the trench.

19. The charge-trapping memory cell according to claim 13, wherein the memory layer sequence is arranged on a top surface and sidewall surfaces of the fins.

20. The charge trapping memory cell according to claim 13, wherein the select lines comprise a first select line coupled to each select transistor in the first plurality of select transistors and a second select line coupled to each select transistor in the second plurality of select transistors.

21. The charge trapping memory cell according to claim 13, wherein the select transistors are arranged such that each fin includes:
a first normally-on transistor adjacent a first end of the fin;
a first normally-off transistor adjacent the first end of the fin;
a second normally-on transistor adjacent a second end of the fin; and
a second normally-off transistor adjacent the second end of the fin.

22. The charge trapping memory cell according to claim 21, wherein the normally-on transistors of every other fin and the normally-off transistors of intervening fins between the every other fin are coupled to a common select line.

23. The charge trapping memory cell according to claim 22, wherein the normally-off transistors of the every other fin and the normally-on transistors of the intervening fins are coupled ton second common select line.

* * * * *

UNITED STATES PATENT AND TRADEMARK OFFICE
CERTIFICATE OF CORRECTION

PATENT NO. : 7,298,004 B2
APPLICATION NO. : 11/000350
DATED : November 20, 2007
INVENTOR(S) : Specht et al.

It is certified that error appears in the above-identified patent and that said Letters Patent is hereby corrected as shown below:

In Col. 3, line 59, delete "suicide" and insert --silicide--.
In Col. 4, line 1, delete "ranged" and insert --arranged--.
In Col. 4, line 36, delete "mask." and insert --mask--.
In Col. 6, line 37, delete "t," and insert --1,--.
In Col. 7, line 13, delete "finishing" and insert --fins being--.
In Col. 7, line 16, delete "ranged" and insert --arranged--.
In Col. 7, line 38, delete "Cm." and insert --fin.--.
In Col. 8, line 38, delete "ton" and insert --to a--.

Signed and Sealed this

First Day of April, 2008

JON W. DUDAS
*Director of the United States Patent and Trademark Office*